United States Patent [19]

Katsutsugu

[11] Patent Number: 4,904,311
[45] Date of Patent: Feb. 27, 1990

[54] METALLIC POWDER AND A PASTE MADE FROM IT, AND A METALLIC POWDER MANUFACTURE DEVICE

[75] Inventor: Kitada Katsutsugu, Kanagawa, Japan

[73] Assignee: Electroplating Engineers of Japan, Limited, Japan

[21] Appl. No.: 291,504

[22] Filed: Dec. 29, 1988

[30] Foreign Application Priority Data

Jan. 14, 1988 [JP] Japan .................................. 63-4837

[51] Int. Cl.⁴ ............................................. B23K 35/34
[52] U.S. Cl. .................................. 148/24; 75/0.5 C; 75/251
[58] Field of Search ................. 75/251, 0.5 C; 148/24

[56] References Cited

U.S. PATENT DOCUMENTS

| | | | |
|---|---|---|---|
| 2,087,019 | 7/1937 | Clement | 18/48 |
| 2,738,548 | 3/1956 | Kassel | 18/2.7 |
| 4,624,409 | 11/1986 | Takeda | 75/0.5 C |
| 4,732,369 | 3/1988 | Araya | 75/0.5 C |
| 4,744,821 | 5/1988 | Yabuki | 75/0.5 C |

Primary Examiner—Peter D. Rosenberg
Attorney, Agent, or Firm—Klauber & Jackson

[57] ABSTRACT

A metallic powder which is formed by the extrusion, from multiple microscopic nozzle holes, of molten metal, which while falling and cooling changes shape from a droplet to a generally spherical shape and then solidifies, this microscopic metallic powder (around 20–90 μm in size for example) having non-curved sections in parts of the generally curved surface and being suitable as solder.

7 Claims, 4 Drawing Sheets

METALLIC POWDER AND A PASTE MADE FROM IT, AND A METALLIC POWDER MANUFACTURE DEVICE

BACKGROUND OF THE INVENTION

1. Field of the Invention

This invention concerns a metallic powder and a paste made from that powder, and a device for manufacturing that metallic powder.

2. Description of the Prior Art

Powders and pastes obtained through the use of techniques such as the atomization method, the rolling method, the solubility method, and the reduction/mixing method have been known in prior art. However, each of these techniques had advantages and disadvantages: the atomization method gave a bad yield in powder production because the powder thus produced contained a dust-like substance called "fine", while the rolling method or the solubility method could not produce powders with particles of a small enough size and were unsuitable for mass-production, while the reduction/mixing method produced a powder too fine and not suitable as solder. Powder manufacture using a nozzle method had also been previously considered, but because the powder produced had a large particle size, it had not been thought possible to produce the microscopic 20–90 $\mu$m size of this invention.

As the density of surface mounting of chips on printed circuit boards has increased, the gaps between the patterns on the printed circuit boards have been reduced. Consequently, the powders or pastes used to surface mount these chips on the printed circuit board must satisfy certain conditions, including but not limited to improvement of flux, such as they must be sufficiently small in size, have good granularity, no fine, and no "dulling" after printing or painting. However, none of the powders or pastes made using former methods were able to satisfy these requirements.

SUMMARY OF THE INVENTION

This invention aims to present a powder and paste which satisfies the above conditions of being of sufficiently small size, having no fine, not "dulling" after printing or painting; and a device for manufacturing this powder.

These and other objects, advantages, features and uses of this invention will become more apparent as the description proceeds, when considered with the accompanying drawings.

DESCRIPTION OF THE PREFERRED EMBODIMENTS

The embodiments of this invention will be described with reference to the drawings. In this description, "metallic powder" and "paste" have many of the same features so where necessary for the purposes of explanation, the metallic powder will be described as "solder powder", and the paste as "solder paste".

In the above and in the description which follows, the term "powder" is used in the broad sense of the word, meaning both one particle and a collection of multiple particles.

First, the "solder powder" will be described.

Figure 1:
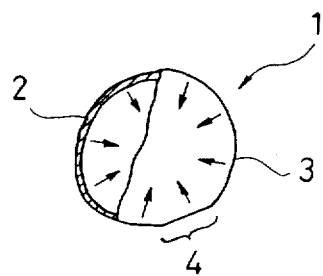
FIG. 1 is a partially cut-away side view of the powder.
Figure 3:
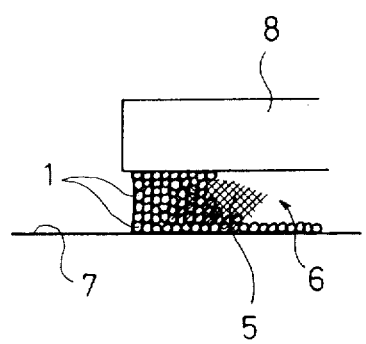
FIG. 3 is a side view showing a chip mounted on the printed circuit board, using solder paste.

When molten solder is extruded through microscopic nozzle holes of less than 100 $\mu$m in size, for example 18 $\mu$m, in an inert gas atmosphere, that molten solder forms extremely small long vertical conical shapes, continuously hanging from the nozzle holes, and at the tip of these continuous shapes, molten solder changes from droplet shapes to microscopic spherical shapes, of 44 $\mu$m in size at that point, which continue falling and solidifying to form the desired powder. As shown in FIG. 1, the molten solder (powder) 1 in this spherical forms a non-oxidisable sphere, as internal oxidation is avoided through the cooling and solidifying of the outer layer 2. Examination and enlargement of this sphere (powder) 1 under a microscope indicates that for some reason not entirely clear, part of the curved surface 3 (the surface drawn in a smooth curve) has a non-curved surface part 4 (non-smooth surface with a flat or ridged surface). Through the provision of this non-curved surface 4 on part of the curved surface 3, when a solder paste 6 made by kneading this powder 1 into a flux 5 is used to print onto a printed circuit board 7, the solder does not indicate "dulling" and further when a chip package 8 is placed on top (in FIG. 3), the fact that solder balls do not occur after solder heating and melting (reflow) can be verified.

The flux 5 includes flux for dissolving evenly such elements as rosin for purification of the metal surface and prevention of re-oxidation during heating; an activator for purification of the metal surface; and a viscosity agent for regulation of viscosity.

A powder 1 of the said content, and of the desired small size and uniformity, with an even size distribution, can be efficiently obtained from molten solder extruded from numerous microscopic nozzle holes. Further, the powder 1 thus obtained has no fine, and if kneaded into the said flux 5 and used as a paste 6, solder balls do not occur after reflow.

Figure 2:
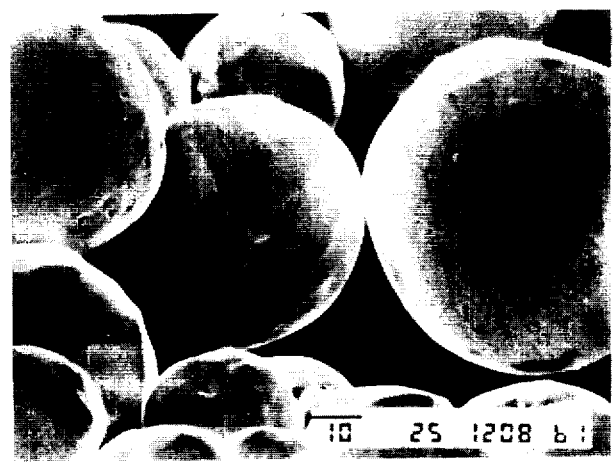
FIG. 2 is a microscope photograph of the particles at 1000 times magnification showing that the powder has no fine, and part of the curved surface has a non-curved part.
Figure 4:
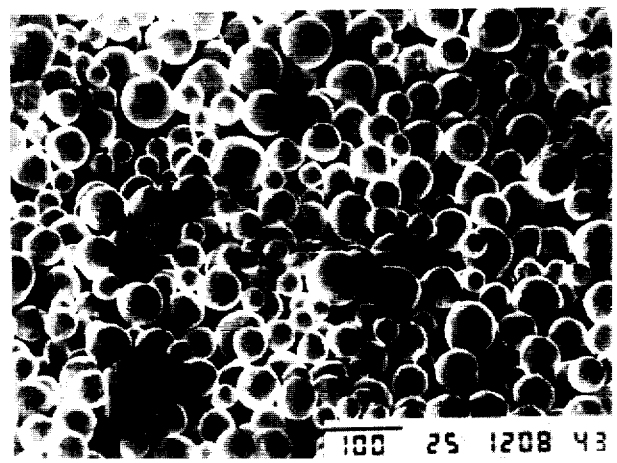
FIG. 4 is a microscope photograph of the particles at 150 times magnification showing powder of a uniform size, around 37–90 $\mu$m in diameter.
Figure 5:
FIG. 5 is a microscope photograph at 200 times magnification showing that there is no conspicuous occurrence of solder balls after heating and melting (reflow) of the solder.

This situation is demonstrated in the microscope photographs. FIG. 2 demonstrates, at 1000 times magnification, that the powder 1 contains no fine, and that parts of the curved surface have non-curved surfaces. FIG. 4 is a photograph at 150 times magnification, with the powder obtained through sifting to the 37–90 $\mu$m range being extremely evenly sized. FIG. 5 is a a photograph taken at 200 times magnification, indicating that solder balls do not occur after solder heating and melting (reflow).

The "metallic powder and paste made from it" of this invention, does not apply only to the solder powder and solder paste as described above, but may also apply to copper alloy powder and its copper paste, gold alloy paste and its gold wax, silver alloy powder and its silver wax, or zinc powder, indium alloy powder, and its paste. However, description of these additional types has been omitted in order to reduce redundancy.

Next, the metallic powder manufacture device will be described.

Figure 6:
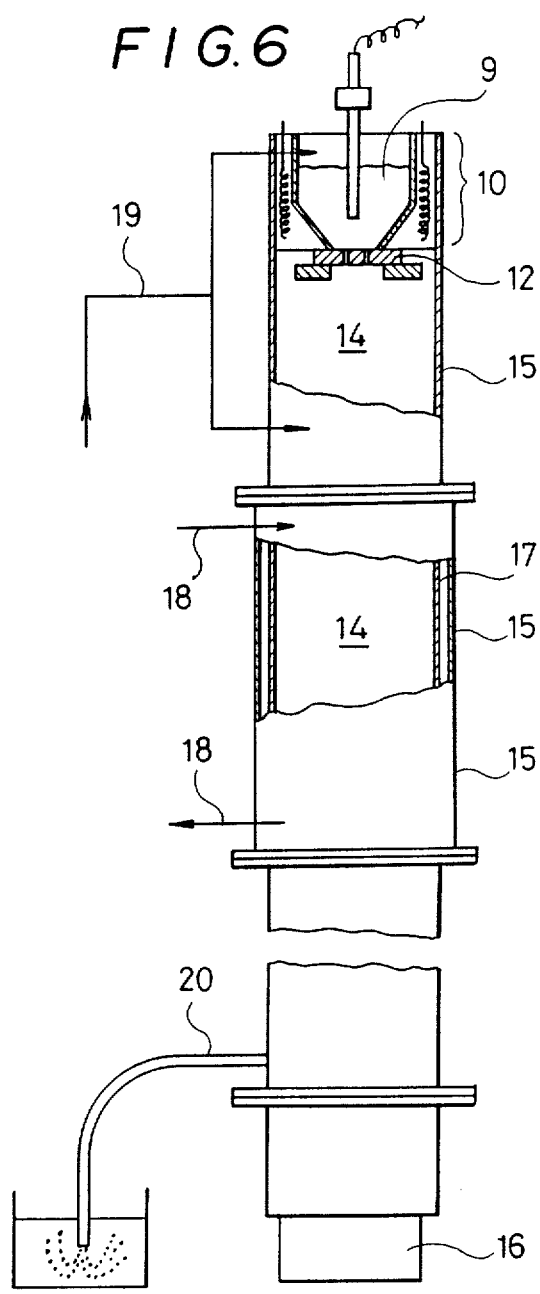
FIG. 6 is an overall side view of the device, partially cut-away to indicate the metallic powder manufacture device.
Figure 7:
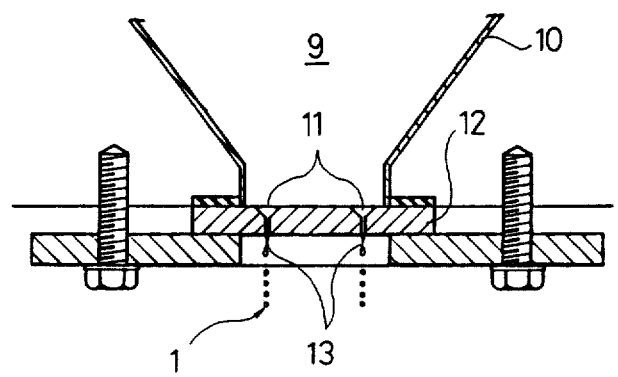
FIG. 7 is an enlarged side section view of the extruded nozzle area.

In describing the device used to obtain powder 1 with reference to the drawings FIGS. 6 and 7, the device is constructed serially, from top to bottom, of a pressure vessel 10 used to contain the molten metal 9 and to heat it and maintain its temperature; an extrusion nozzle 12, provided with multiple microscopic nozzle holes 11 arranged at the bottom of the said pressure vessel 10; a case 15 with a processing space 14, on the exit side of the nozzle holes 11, and in which the molten metal 13 which is extruded from the nozzle holes 11 continuously falls and is cooled; and a powder extraction vessel 16 provided at the bottom of the case 15. Within the case 15 is provided a cooling jacket 17 as a cooling means, and a cooled water inlet and outlet 18, with the inert gas introduction means 19 connected to both the said pressure vessel 10 and the case 15, and the inert gas discharge means 20 connected at the bottom of the case 15.

The metallic powder and paste, along with the metal powder manufacture device, of this invention, as described above, have the following benefits.

a. Because parts of the curved surface of the powder are non-curved, the powder is internally stable and paste made using this powder will not "dull" after printing or painting.

b. The molten metal extruded from the nozzle holes of microscopic size, forms hanging continuous shapes, microscopic long vertical conical shapes, which change from droplet to spherical shape (powder), producing shapes microscopic in size.

c. The spherical molten metal becomes powder as designed as the microscopic spheres solidify while falling, and because the outer layer hardens through cooling processing, oxidation of the inside is prevented, and further since it does not oxidise, the paste made from the powder can be preserved for long periods, without deterioration in the solderability of the paste, making use very economical since the whole amount can be used until it runs out, there being no need to dispose of it in the meantime.

d. Through use of nozzles holes of different sizes, the size of the powder can be regulated easily, and powder of uniform size can be obtained in large amounts.

e. Where nozzle holes of around 18 $\mu$m in size are used, the average size of the powder is 55-60 $\mu$m, providing a very uniform powder without any fine.

f. Since an extremely evenly sized powder is obtained, solder paste made using this powder performs well in painting (printing) on printed circuit boards and is ideal for high-density (narrowly spaced) patterns.

What is claimed is:

1. A metallic powder made by extrusion of molten metal from multiple microscopic nozzle holes in an inert gas atmosphere, cooled while falling, and during that cooling changing its overall shape from droplet shape to generally spherical shape and hardening, said metallic powder being characterized by having non-curved sections in parts of the generally curved surface forming the sphere.

2. The metallic powder of claim 1 in which the molten metal is molten solder and the metallic powder is solder powder.

3. A solder paste made by kneading the solder powder of claim 2 into flux.

4. The metallic powder of claim 1 in which the molten metal is molten copper alloy, molten gold alloy or molten silver alloy, and the metallic powder is copper alloy powder, gold alloy powder or silver alloy powder.

5. Copper paste, gold wax, or silver wax made by kneading the powders of claim 4.

6. A metal powder manufacturing device in which molten metal, under continuous pressure of an inert gas atmosphere, is forced through nozzle holes in an extrusion nozzle provided with multiple nozzle holes, microscopic droplets being made to fall from the tips of continuous hanging shapes, the shape of said droplets being altered from droplet shape to generally spherical shape as they cool and solidify while falling continuously at the pressure created by the inert gas.

7. A metallic powder useful as a solder prepared by extrusion of molten metal from multiple nozzle holes less than 100 $\mu$m in diameter in an inert gas atmosphere, cooled while falling, and during said cooling changing its overall shape from droplet shape to generally spherical shape and hardening, said metallic powder being characterized by having non-curved sections formed in the otherwise generally curved surface defining the sphere, and by being in the size range of 20-90 $\mu$m in diameter.

* * * * *